United States Patent
Oh et al.

(10) Patent No.: US 9,716,017 B2
(45) Date of Patent: Jul. 25, 2017

(54) SEMICONDUCTOR PACKAGES INCLUDING INTERPOSER AND METHODS OF MANUFACTURING THE SAME

(71) Applicant: SK hynix Inc., Icheon-si, Gyeonggi-do (KR)

(72) Inventors: Tac Keun Oh, Seoul (KR); Seung Taek Yang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/957,845

(22) Filed: Dec. 3, 2015

(65) Prior Publication Data

US 2016/0379845 A1    Dec. 29, 2016

(30) Foreign Application Priority Data

Jun. 25, 2015   (KR) .................. 10-2015-0090451

(51) Int. Cl.
*H01L 21/00*   (2006.01)
*H01L 21/48*   (2006.01)
(Continued)

(52) U.S. Cl.
CPC ........ *H01L 21/486* (2013.01); *H01L 21/4853* (2013.01); *H01L 24/19* (2013.01); *H01L 24/20* (2013.01); *H01L 24/96* (2013.01); *H01L 24/97* (2013.01); *H01L 21/561* (2013.01); *H01L 21/565* (2013.01); *H01L 21/568* (2013.01); *H01L 24/16* (2013.01); *H01L 24/81* (2013.01); *H01L 2224/0401* (2013.01); *H01L 2224/04105* (2013.01); *H01L 2224/12105* (2013.01); *H01L 2224/16235* (2013.01); *H01L 2224/81005* (2013.01); *H01L 2224/92144* (2013.01); *H01L 2224/97* (2013.01); *H01L 2924/14* (2013.01); *H01L 2924/1434* (2013.01);
(Continued)

(58) Field of Classification Search
None
See application file for complete search history.

(56) References Cited

U.S. PATENT DOCUMENTS

2004/0033654 A1* 2/2004 Yamagata ............... H01L 23/50
                                                                         438/202
2009/0146297 A1* 6/2009 Badakere .............. H01L 21/568
                                                                         257/737

(Continued)

*Primary Examiner* — Reema Patel
(74) *Attorney, Agent, or Firm* — William Park & Associates Ltd.

(57) ABSTRACT

A semiconductor package may include a semiconductor die mounted on a first surface of an interposer die so that a die connection portion of the semiconductor die faces to the first surface of the interposer die, a protection portion may be disposed on the first surface of the interposer die to cover the semiconductor die, and an interconnection structure disposed in and on the interposer die. The interconnection structure may include an external connection portion that is located on a second surface of the interposer die opposite to the semiconductor die, a through electrode portion that penetrates the interposer die to have an end portion combined with the die connection portion, and an extension portion that connects the through electrode portion to the external connection portion. Related methods are also provided.

11 Claims, 21 Drawing Sheets

(51) Int. Cl.
　　　*H01L 21/56*　　　(2006.01)
　　　*H01L 23/00*　　　(2006.01)

(52) U.S. Cl.
　　　CPC ............... *H01L 2924/15311* (2013.01); *H01L 2924/18161* (2013.01); *H01L 2924/18162* (2013.01)

(56) References Cited

U.S. PATENT DOCUMENTS

| | | |
|---|---|---|
| 2014/0134796 A1 | 5/2014 | Kelly et al. |
| 2014/0147970 A1 | 5/2014 | Kim et al. |
| 2014/0361426 A1* | 12/2014 | Moon ..................... H01L 24/14 257/737 |

* cited by examiner

SEMICONDUCTOR PACKAGES INCLUDING INTERPOSER AND METHODS OF MANUFACTURING THE SAME

CROSS-REFERENCE TO RELATED APPLICATION

The present application claims priority under 35 U.S.C 119(a) to Korean Application No. 10-2015-0090451, filed on Jun. 25, 2015, in the Korean Intellectual Property Office, which is incorporated herein by reference in its entirety.

BACKGROUND

1. Technical Field

Various embodiments of the present disclosure generally relate to a packaging technology and, more particularly, to semiconductor packages including an interposer and methods of manufacturing the same.

2. Related Art

Semiconductor devices employed in electronic systems may consist of various electronic circuit elements. These electronic circuit elements may be integrated on a semiconductor substrate referred to as a semiconductor chip or a die. Semiconductor packages may be provided to protect the electronic circuit elements or the semiconductor chips from physical damage or environmental impact. The semiconductor packages may be employed in the electronic products such as computers, mobile devices, or data storages. As the electronic products such as smart phones are continuously scaled down, small and thin semiconductor packages are increasingly in demand.

SUMMARY

According to an embodiment, a method of manufacturing a semiconductor package may be provided. The method of manufacturing a semiconductor package may include forming via holes extending from a first surface of an interposer wafer into a body of the interposer wafer and forming interconnection structures in the via holes and on the first surface of the interposer wafer. Each of the interconnection structures may be formed to include a through electrode portion filling one of the via holes, an external connection portion disposed on the first surface of the interposer wafer, and an extension portion connecting the through electrode portion to the external connection portion. A second surface of the interposer wafer opposite to the external connection portions may be recessed to expose end portions of the through electrode portions at the recessed second surface. A semiconductor die may be mounted on the recessed second surface of the interposer wafer to electrically connect die connection portions of the semiconductor die to the end portions of the through electrode portions. A protection portion covering the semiconductor die may be formed on the recessed second surface of the interposer wafer.

According to an embodiment, a method of manufacturing a semiconductor package may be provided. The method of manufacturing the semiconductor package may include attaching a semiconductor die to a first surface of an interposer wafer so that die connection portions of the semiconductor die face towards the first surface. The method may include forming a protecting portion covering the semiconductor die on the first surface of the interposer wafer. The method may include recessing a second surface of the interposer wafer opposite to the semiconductor die to reduce a thickness of the interposer wafer. The method may include forming via holes in the interposer wafer having the recessed second surface to expose the die connection portions. The method may include forming interconnection structures in the via holes and on the recessed second surface of the interposer wafer. Each of the interconnection structures may be formed to include a through electrode portion filling one of the via holes, an external connection portion disposed on the recessed second surface of the interposer wafer, and an extension portion connecting the through electrode portion to the external connection portion.

According to an embodiment, a semiconductor package may be provided. The semiconductor package may include an interposer die having a first surface and a second surface which are opposite to each other. An interconnection structure may be disposed in and on the interposer die. The interconnection structure may include a through electrode portion penetrating the interposer die having an end portion exposed at the second surface, an external connection portion that may be disposed on the first surface of the interposer die, and an extension portion connecting the through electrode portion to the external connection portion. A semiconductor die may be disposed on the second surface of the interposer die so that a die connection portion of the semiconductor die may be coupled with the end portion of the through electrode portion. A protection portion may be disposed on the second surface of the interposer die covering the semiconductor die.

According to an embodiment, a semiconductor package may be provided. The semiconductor package may include a semiconductor die mounted on a first surface of an interposer die so that a die connection portion of the semiconductor die faces towards the first surface of the interposer die. The semiconductor package may include a protection portion disposed on the first surface of the interposer die covering the semiconductor die. The semiconductor package may include an interconnection structure disposed in and on the interposer die. The interconnection structure may include an external connection portion located on a second surface of the interposer die opposite to the semiconductor die, a through electrode portion penetrating the interposer die having an end portion coupled with the die connection portion, and an extension portion connecting the through electrode portion to the external connection portion.

According to an embodiment, there may be provided a memory card including a semiconductor package. The semiconductor package may include an interposer die having a first surface and a second surface opposite to each other. An interconnection structure may be disposed in and on the interposer die. The interconnection structure may include a through electrode portion penetrating the interposer die having an end portion exposed at the second surface, an external connection portion disposed on the first surface of the interposer die, and an extension portion connecting the through electrode portion to the external connection portion. A semiconductor die may be disposed on the second surface of the interposer die so that a die connection portion of the semiconductor die may be coupled with the end portion of the through electrode portion. A protection portion may be disposed on the second surface of the interposer die covering the semiconductor die.

According to an embodiment, there may be provided a memory card including a semiconductor package. The semiconductor package may include a semiconductor die mounted on a first surface of an interposer die so that a die connection portion of the semiconductor die faces towards the first surface of the interposer die. The semiconductor package may include a protection portion disposed on the first surface of the interposer die covering the semiconductor die, and an interconnection structure disposed in and on the interposer die. The interconnection structure may include an external connection portion located on a second surface of the interposer die opposite to the semiconductor die, a through electrode portion penetrating the interposer die having an end portion coupled with the die connection portion, and an extension portion connecting the through electrode portion to the external connection portion.

According to an embodiment, there may be provided an electronic system including a semiconductor package. The semiconductor package may include an interposer die having a first surface and a second surface opposite to each other. An interconnection structure may be disposed in and on the interposer die. The interconnection structure may include a through electrode portion penetrating the interposer die having an end portion exposed at the second surface, an external connection portion disposed on the first surface of the interposer die, and an extension portion connecting the through electrode portion to the external connection portion. A semiconductor die may be disposed on the second surface of the interposer die so that a die connection portion of the semiconductor die may be coupled with the end portion of the through electrode portion. A protection portion may be disposed on the second surface of the interposer die covering the semiconductor die.

According to an embodiment, there may be provided an electronic system including a semiconductor package. The semiconductor package may include a semiconductor die mounted on a first surface of an interposer die so that a die connection portion of the semiconductor die faces towards the first surface of the interposer die, a protection portion disposed on the first surface of the interposer die covering the semiconductor die, and an interconnection structure disposed in and on the interposer die. The interconnection structure may include an external connection portion located on a second surface of the interposer die opposite to the semiconductor die, a through electrode portion penetrating the interposer die having an end portion combined with the die connection portion, and an extension portion connecting the through electrode portion to the external connection portion.

DETAILED DESCRIPTION

Figure 1:
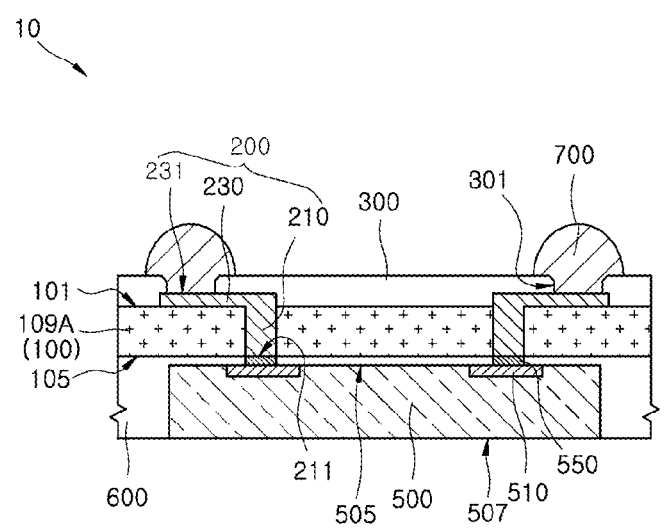
FIGS. 1 and 2 are a cross-sectional view and a perspective view illustrating representations of examples of a semiconductor package according to an embodiment, respectively.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the concepts.

Semiconductor packages may include electric devices such as semiconductor chips, and the semiconductor chips may be obtained by separating a semiconductor substrate such as a wafer into a plurality of pieces using a die sawing process. The semiconductor chips may correspond to memory chips or logic chips. The memory chips may include, for example but not limited to, dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chips may include logic circuits which are integrated on and/or in the semiconductor substrate. The semiconductor packages may be applied to, for example but not limited to, information/communication systems such as mobile terminals, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to other drawings.

Figure 2:
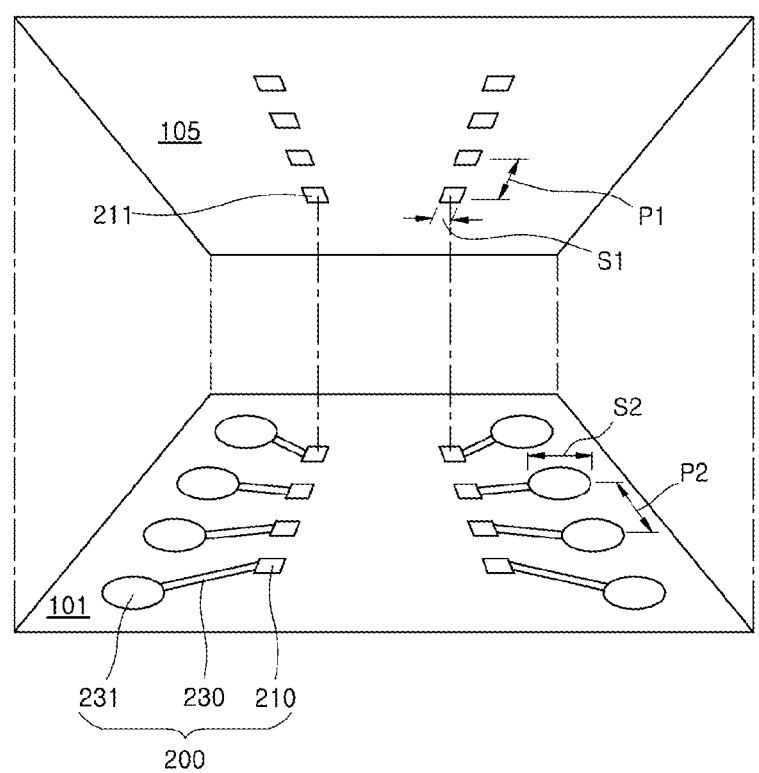

FIGS. 1 and 2 are schematic views illustrating representations of examples of a semiconductor package 10 according to an embodiment, respectively.

Referring to FIG. 1, the semiconductor package 10 may be configured to include an interposer die 109A and a semiconductor die 500 which are stacked. The interposer die 109A may have a shape of a substrate including a first surface 101 corresponding to a front surface and a second surface 105 corresponding to a backside surface. The interposer die 109A may be one of a plurality of dice which are provided by sawing an interposer wafer corresponding to a bare silicon wafer. The interposer die 109A may be formed by processing the bare silicon wafer, but may be provided by processing another material substrate such as a glass substrate.

The interposer die 109A may include interconnection structures 200 to act as a member that provides electrical connecting wires. Each of the interconnection structures 200 may include a through electrode portion 210 that substantially penetrates a body of the interposer die 109A to reach the second surface 105. An end portion 211 of the through electrode portion 210 may be exposed at the second surface 105. The other end portion of the through electrode portion 210 opposite to the end portion 211 may extend onto the first surface 101 to provide an extension portion 230. The extension portion 230 may be provided as a connection portion or an extension portion that electrically connects the through electrode portion 210 to an external connection portion 231 which is located on the first surface 101 of the interposer die 109A to be spaced apart and offset from the through electrode portion 210 by a predetermined distance. The extension portion 230, the external connection portion 231 and the through electrode portion 210 constituting the interconnection structure 200 may be comprised of a single unified body. Since the extension portion 230, the external connection portion 231 and the through electrode portion 210 are provided as a single unified body without any heterogeneous junction therein, a resistance value of the interconnection structure 200 may be minimized.

A dielectric layer pattern 300 having openings 301 exposing the external connection portions 231 may be provided on the first surface 101 of the interposer die 109A. External connection terminals 700 may be attached to the external connection portions 231, respectively. Each of the external connection terminals 700 may include a connection member such as a solder bump or a solder ball.

A semiconductor die 500 may be mounted on the second surface 105 of the interposer die 109A. The semiconductor die 500 may have a shape of a chip including a third surface 505 on which die connection portions 510 electrically connected to interposer die 109A are disposed and a fourth surface 507 which is opposite to the third surface 505. The semiconductor die 500 may be aligned with the interposer die 109A so that the die connection portions 510 of the semiconductor die 500 vertically overlap with the end portions 211 of the through electrode portions 210 respectively. The die connection portions 510 may be electrically connected to the end portions 211 of the through electrode portions 210 through interconnectors 550, respectively. Each of the interconnectors 550 may include a conductive bump or a solder layer. The semiconductor die 500 may be a memory semiconductor die including integrated circuits.

A protection portion 600 covering sidewalls of the semiconductor die 500 and the second surface 105 of the interposer die 109A may be provided. The protection portion 600 may include a dielectric material such as epoxy molding compound (EMC). The protection portion 600 may be provided so that the fourth surface 507 of the semiconductor die 500 is exposed. The protection portion 600 may expand or extend to fill a space between the third surface 505 of the semiconductor die 500 and the second surface 105 of the interposer die 109A. The protection portion 600 may surround and protect the interconnectors 550.

Referring to FIGS. 1 and 2, the external connection portion 231 corresponding to a part of the interconnection structure 200 may be provided on the first surface 101 of the interposer die 109A to act as an extension of the through electrode portion 210. The through electrode portions 210 may be disposed in the interposer die 109A to overlap with the die connection portions 510 of the semiconductor die 500, respectively. The external connection portions 231 laterally extending from the through electrode portions 210 may be offset from the through electrode portions 210. In some embodiments, the external connection portions 231 may be disposed on edges of the interposer die 109A. The external connection terminals 700 connected to the external connection portions 231 may also be provided to be offset from the die connection portions 510.

Since the external connection portions 231 are provided to be offset from the die connection portions 510, the external connection portions 231 may have a line width size S2 and a pitch size P2 which are different from those of the die connection portion 510. Since the end portions 211 of the through electrode portion 210 are located to be aligned with the die connection portions 510, the through electrode portions 210 or the end portions 211 of the through electrode portions 210 may be provided to have substantially the same pitch size P1 as the die connection portions 510. The line width size S1 of the end portions 211 of the through electrode portions 210 may not be equal to a line width size of the die connection portions 510. However, in some embodiments, the line width size S1 of the end portions 211 may be set to be less than the pitch size P1 so that the end portions 211 have the same pitch size P1 as the die connection portions 510. Since each of the external connection portions 231 extends from one of the through electrode portions 210 onto one edge of the interposer die 109A through the extension portion 230, the line width size S2 of the external connection portions 231 may be greater than the line width size S1 of the end portions 211 of the through electrode portions 210. In addition, the external connection portions 231 may also be disposed to have the pitch size P2 which is greater than the pitch size P1 of the end portions 211 of the through electrode portion 210.

As illustrated in FIGS. 1 and 2, if the external connection portions 231 are disposed to have the line width size S2 and the pitch size P2 which are greater than those of the through electrode portions 210, an area of the first surface 101 of the interposer die 109A may be greater than an area of the third surface 505 of the semiconductor die 500. In addition, the external connection portions 231 may be disposed to be closer to sidewalls of the interposer die 109A than the through electrode portions 210. Since the external connection portions 231 are offset from the through electrode portions 210 without overlapping with the through electrode portions 210, the extension portions 230 connecting the external connection portions 231 to the through electrode portions 210 may be included in the interconnection structures 200.

When the die connection portions 510 of the semiconductor die 500 are disposed on the edge portions of the semiconductor die 500 in two columns in the shape of edge pads, the through electrode portions 210 may also be disposed to be aligned with the die connection portions 510 side by side in two columns, as illustrated in FIG. 2. The external connection portions 231 may also be disposed side by side in two columns to the outside of the through electrode portions 210, and to the edges of the interposer die 109A of FIG. 1.

Referring to FIGS. 1 and 2 together, the interconnection structure 200 may include the through electrode portion 210 aligned with be overlapped with the die connection portion 510 of the semiconductor die 500, and may be provided so that the end portion 211 of the through electrode portion 210 is directly overlapped with the die connection portion 510. Accordingly, the semiconductor die 500 may be directly mounted on the second surface 105 of the interposer die 109A. Since a separate interconnection is not introduced between the semiconductor die 500 and the second surface 105 of the interposer die 109A, the total thickness of the semiconductor package 10 may be derived thinner.

The through electrode portion 210 may have a length enough to penetrate the body of the interposer die 109A, and may extend to be connected to the external connection portion 231 located on the first surface 101 of the interposer die 109A. Since the external connection portion 231 located on the first surface 101 of the interposer die 109A and the through electrode portion 210 are provided as a conductive layer having single body, it is not necessary to introduce a separate interconnection to electrically connect the external connection portion 231 and the through electrode portion 210. Accordingly, the total thickness of the semiconductor package 10 may be derived thinner.

FIGS. 3 to 11 are cross-sectional views illustrating representations of examples of methods of manufacturing the semiconductor package according to various embodiments.

Figure 3:
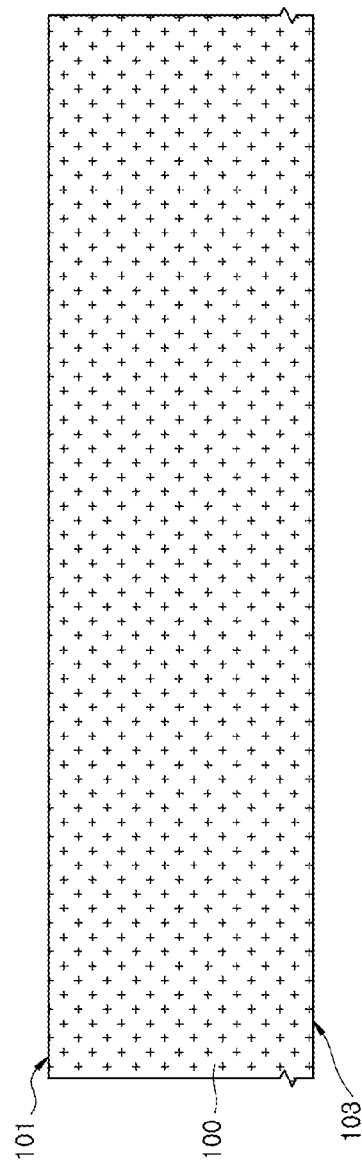
FIGS. 3 to 11 are cross-sectional views illustrating representations of examples of methods of manufacturing a semiconductor package according to various embodiments.

FIG. 3 illustrates the step of introducing an interposer wafer 100. Referring to FIG. 3, the interposer wafer 100 may have the shape of a substrate or a wafer including a first surface that may be a front surface and a second surface 103 that may be an initial backside surface opposite to the first surface 101. The interposer wafer 100 may be provided as a bare silicon wafer. Since the interposer wafer 100 is introduced in the shape of a silicon wafer, it is possible to perform wafer processing to the interposer wafer 100. For example, it is possible to apply through silicon via (TSV) technology to the interposer wafer 100. The interposer wafer 100 may be introduced as a member providing the interposer die 109A of FIG. 1. The interposer die 109A of FIG. 1 may be formed thinner than the interposer wafer 100 by subsequent thinning process. The interposer wafer 100 may be made of different materials having the same shape of the wafer. For example, the interposer wafer 100 may be provided with a glass material.

Figure 4:
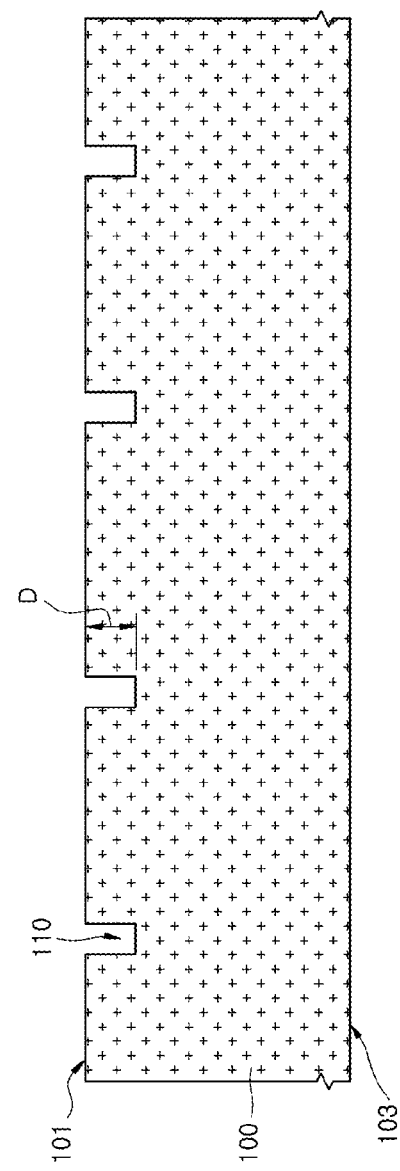

FIG. 4 illustrates the step of forming via holes 110. Referring to FIG. 4, the via holes 110 having a depth D may be formed on the first surface 101 of the interposer wafer 100. The via holes 110 may be formed to have the depth of about 5 μm to about 10 μm by applying dry etching, wet etching or laser etching.

Figure 5:
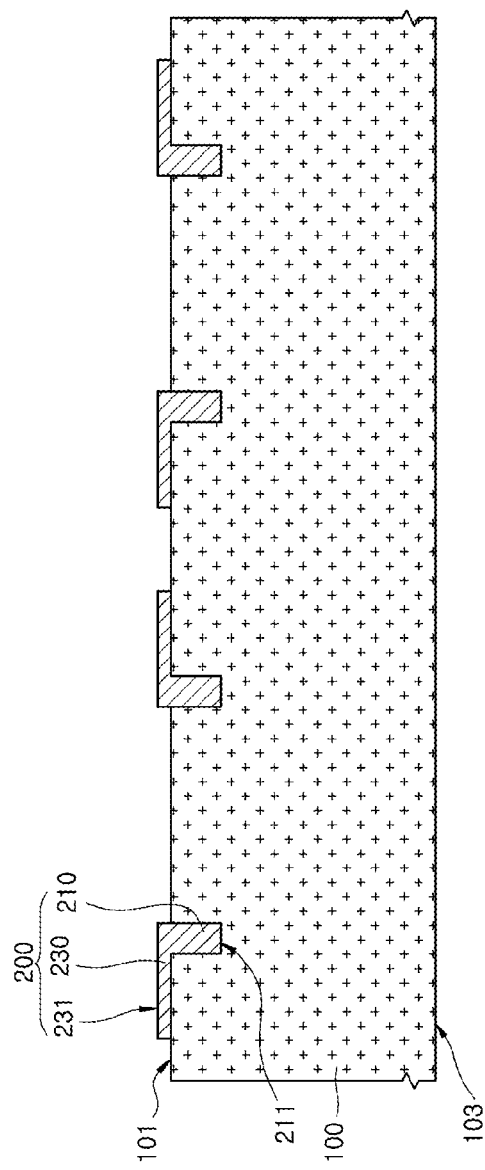

FIG. 5 illustrates the step of forming the interconnection structures 200. Referring to FIG. 5, the interconnection structures 200 filling the via holes 110 of FIG. 4 and extending to the first surface 101 of the adjacent interposer wafer 100 may be formed. For electrical insulation between the interconnection structures 200 and the body of the interposer wafer 100, though not illustrated, an insulation layer or a dielectric layer may be introduced between the interconnection structures 200 and the body of the interposer wafer 100. The insulation layer may be introduced as a layer including silicon oxide ($SiO_2$).

Each of the interconnection structures 200 may include the through electrode portion 210 filling the via hole 110 of FIG. 4. The end portion 211 of the through electrode portion 210 may be located at a bottom portion of the via hole 110 of FIG. 4. Each of the interconnection structures 200 may include an external connection portion 231 located on the first surface 101 of the interposer wafer 100 and connected to external devices, such as other electronic components or module substrates. Each of the interconnection structures 200 may include an extension portion 230 connecting the external connection portion 231 and the through electrode portion 210, and electrically extending the through electrode portion 210 to substantially reach the external connection portion 231. Each of the external connection portions 210 and each of the through electrode portions 210 may be disposed to be matched one by one. The through electrode portion 210, the external connection portion 231 and the extension portion 230 may be formed to include the substantially same layer extended and integrated.

The external connection portion 231 and the extension portion 230 are formed in a layer with the through electrode portion 210. Accordingly, since the external connection portion 231 and the extension portion 230 are not formed in different and separated layers, the procedure for forming them may be simplified. For example, the layers of the interconnection structure 200 that have the shape of the external connection portion 231, the extension portion 230 and the through electrode portion 210 may be formed at the same time by forming a resist pattern (not illustrated) exposing the region in which the external connection portions 231, the extension portions 230 and the through electrode portions 210 are to be formed on the first surface 101 of the interposer wafer 100 and performing a plating process. Since the depth D of the via holes 110 of FIG. 4 is relatively shallow, it is possible to form the conductive layer for the interconnection structure 200 to extend onto the first surface 101 of the interposer wafer 100 to provide the external connection portions 231 and the extension portions 230 while filling the via holes 110. The conductive layer for the interconnection structure 200 may be provided with a metal layer including copper (Cu) layer, but not limited thereto. The interconnection structure 200 may further include a seed layer (not illustrated) for copper plating and a diffusion barrier (not illustrated) for preventing diffusion of copper ions.

Figure 6:
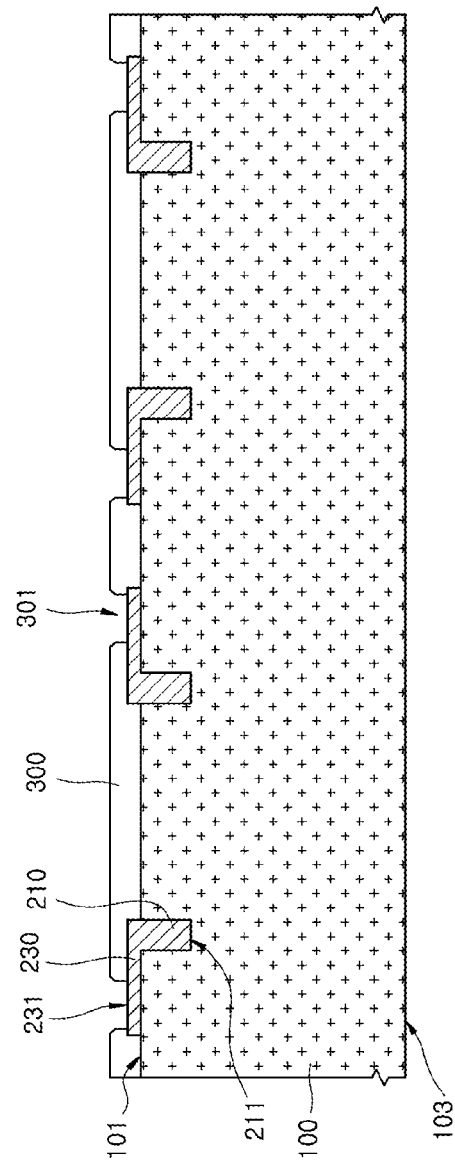

FIG. 6 illustrates the step of forming a dielectric layer pattern 300 exposing the external connection portions 231. Referring to FIG. 6, the dielectric layer pattern 300 having openings 301 exposing the surface of the external connection portions 231 may be formed to cover the first surface 101 of the interposer wafer 100. The dielectric layer pattern 300 may be formed to cover and block the exposed portion of the through electrode portions 210 exposed on the first surface 101 of the interposer wafer 100 and the extension portions 230, and may be formed so that the external connection portions 231 are exposed to outside. The dielectric layer pattern 300 may consist of organic polymer material. The dielectric layer pattern 300 may be formed including a photoresist material.

Figure 7:
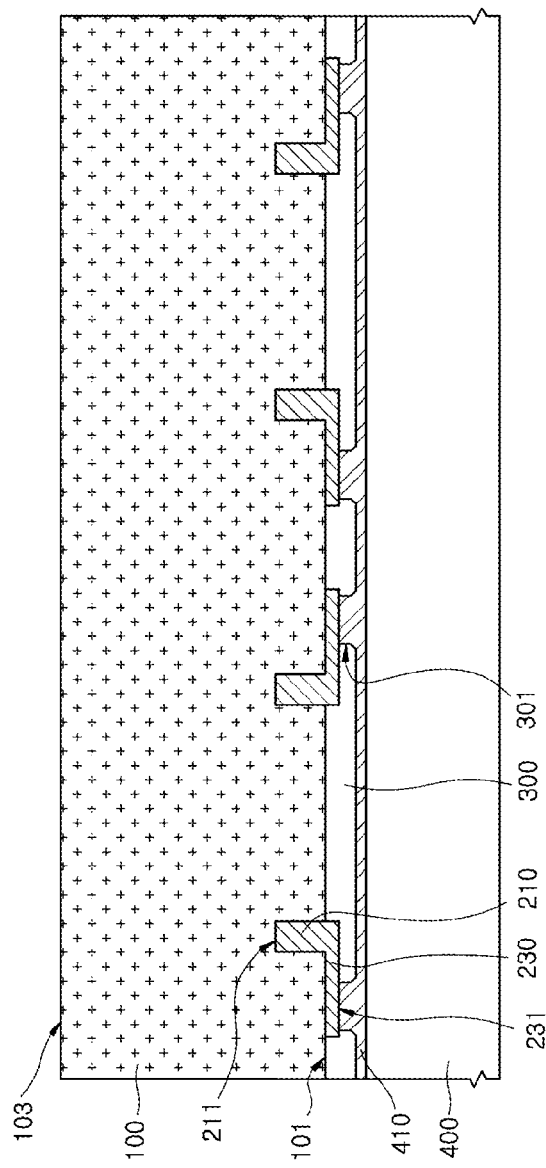

FIG. 7 illustrates the step of attaching a carrier substrate 400. Referring to FIG. 7, the interposer wafer 100 may be attached on the carrier substrate 400. An adhesive layer 410 may be used to attach the carrier substrate 400 on the first surface 101 of the interposer wafer 100. The adhesive layer 410 may be introduced to attach the dielectric layer patterns 300 substantially disposed on the first surface 101 and the carrier substrate 400. The carrier substrate 400 may be introduced as a member for handling of the process for processing the second surface 103 which may be an initial back side of the interposer wafer 100. The carrier substrate 400 may play a role of protecting the first surface 101 in the course of processing the second surface 103.

Figure 8:
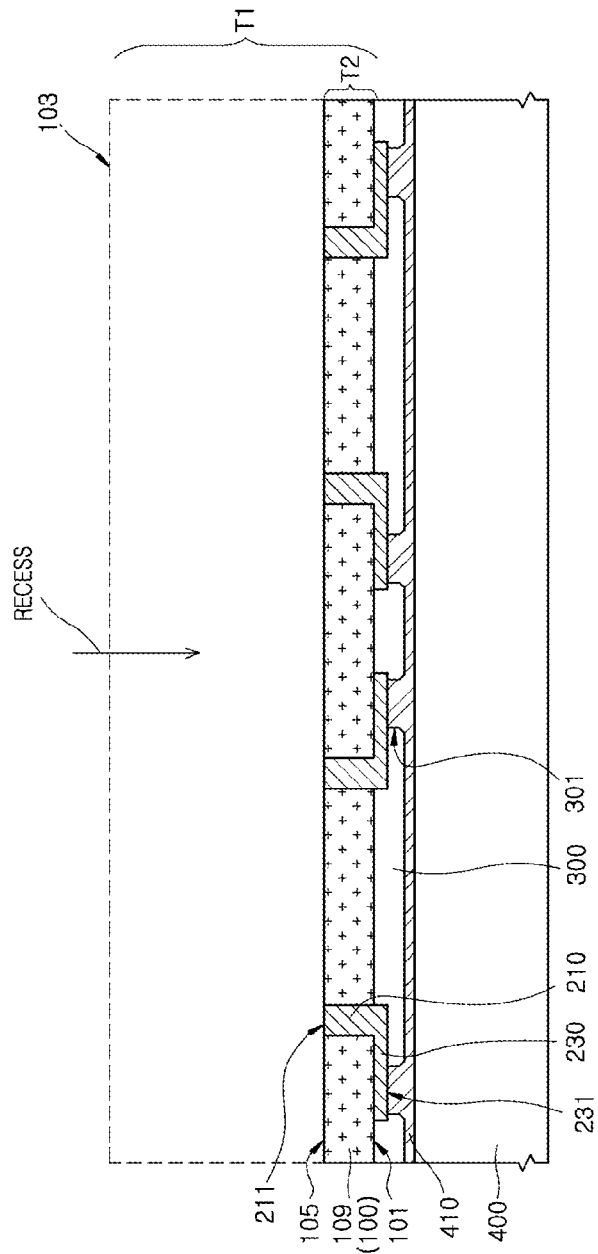

FIG. 8 illustrates the step of recessing the interposer wafer 100. Referring to FIG. 8, the interposer wafer 100 may be fixed to the carrier substrate 400 and the exposed second surface 103 of the interposer wafer 100 may be recessed. The second surface 103 may be recessed by etching or grinding the second surface 103. A chemical mechanical polishing may be applied to the second surface 103 in order to control the degree of recess more finely.

A recessed second surface 105 may be provided by recessing the second surface 103 of the interposer wafer 100. Through this process, the interposer wafer 100 can be transformed into an interposer wafer 109 having thinner thickness T2 than the initial thickness T1. The interposer wafer 109 thinned to have a thinner thickness T2 may be provided to expose the end portions 211 of the through electrode portions 210 to the recessed second surface 105. The interposer wafer 109 may have the substantially same thickness as the depth (D of FIG. 4) of the through electrode portions 210 by performing the CMP process for recessing to expose the end portions 211 of the through electrode portions 210. The CMP process may be adjusted so that the etch rates of the interposer wafer 109 body and the through electrode portions 210 become different each other by adjusting the composition of the slurry applied to the CMP process. If a slurry having higher etch rate for silicon as compared to the etch rate of copper is applied, the CMP process may be adjusted so that the end portions 211 of the through electrode portions 210 are exposed onto the recessed second surface 105 of the interposer wafer 109. The interposer wafer 109 may have a thickness T2 of about 5 μm to 10 μm which may be the depth of the through electrode portions 210. Despite the processed interposer wafer 109 to a thin thickness like this, it can be maintained in a state capable of being handled by the carrier substrate 400.

Figure 9:
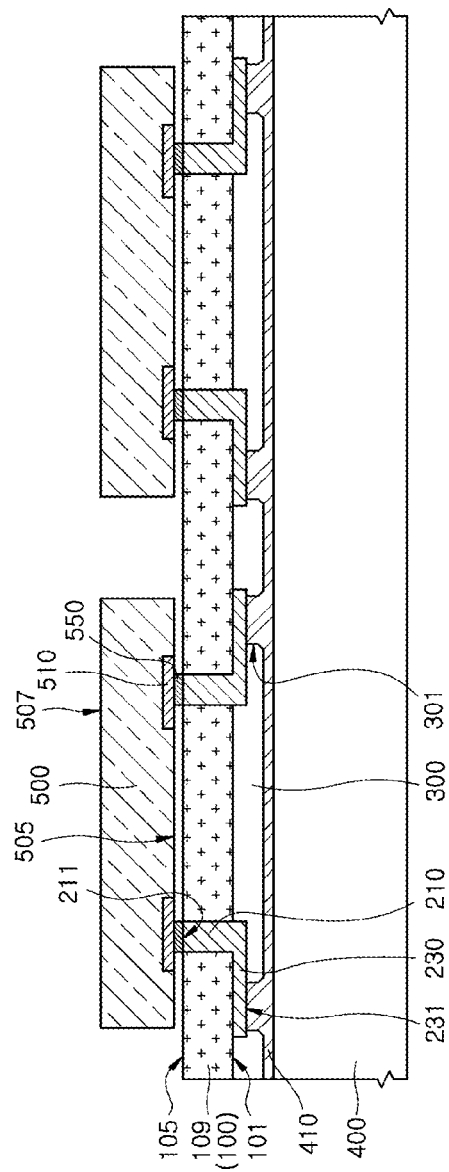

FIG. 9 illustrates the step of mounting the semiconductor dies 500 on the interposer wafer 109. Referring to FIG. 9, the semiconductor dies 500 may be introduced on the interposer wafer 109, and may be aligned so that die connection portions 510 of the semiconductor dies 500 are overlapped with the end portions 211 of the through electrode portions 210 exposed to the second surface 105. Interconnectors 550 may fasten the die connection portions 510 of the semiconductor die 500 and the end portions 211 of the through electrode portion 210 each other and may electrically and physically connect them. Each of the interconnectors 550 may include a shape of a conductive bump or a solder layer. The semiconductor die 500 may be a memory semiconductor die including integrated circuits integrated therein. The semiconductor die 500 may have the shape of a chip including a third surface 505 having the die connection portions 510 for electrical connection with the external devices and a fourth surface 507 opposite to the third surface 505.

Referring to FIG. 9 together with FIG. 4, since the semiconductor dies 500 are mounted on the interposer wafer 109 so that the die connection portions 510 are fastened to the end portions 211 of the through electrode portions 210, the via holes (110 of FIG. 4) to be filled with the through electrode portions 210 may be located at the second surface (101 of FIG. 4) of the interposer wafer (100 of FIG. 4) overlapped with the die connection portions 510 of the semiconductor dies 500.

Figure 10:
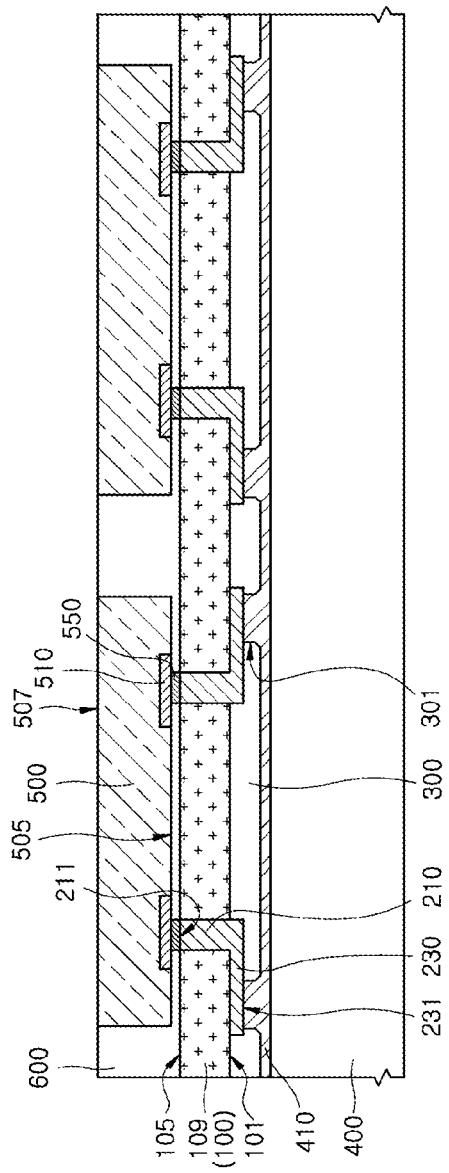

FIG. 10 illustrates the step of forming the protection portions 600. Referring to FIG. 10, the protection portions 600 covering the second surface 105 of the interposer wafer 109 and protecting the side portions of the semiconductor dies 500 may be formed. Each of the protection portion 600 may be formed of a dielectric material. The dielectric material may include epoxy molding compound (EMC). The protection portions 600 may be formed by performing a molding process after mounting a plurality of semiconductor dies 500 side by side on the second surface 105 of the interposer wafer 109. The protection portions 600 may be molded to fill the portion between the semiconductor die 500 and the adjacent different semiconductor die 500. The protection portions 600 may be formed so that the fourth surfaces 507 of the semiconductor dies 500 are exposed. If the protection portions 600 are formed to exposed the fourth surfaces 507 of the semiconductor dies 500 without surrounding the fourth surfaces 507, thin package may be realized because the total thickness of the semiconductor package does not increase that much. In addition, the heat generated in accordance with the operation of the semiconductor dies 500 may be dissipated more effectively through the exposed fourth surfaces 507. The protection portions 600 may be formed in the expanded or extended shape to fill the portion between the semiconductor dies 500 and the second surface 105 of the interposer wafer 109.

Figure 11:
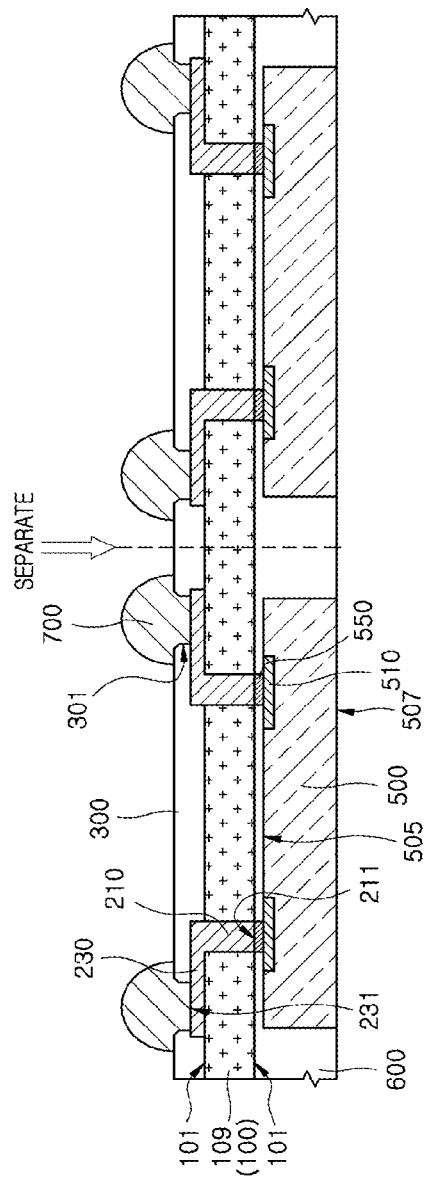

FIG. 11 illustrates the step of attaching the external connection terminals 700 to the external connection portions 231. Referring to FIG. 11, the external connection terminals 700 for external connection may be attached to the external connection portions 231. Each of the external connection terminals 700 may include a connecting member such as a solder bump or a solder ball. Before attaching the external connection terminals 700, the processes of removing the carrier substrate (400 of FIG. 10) and the adhesive layer (410 of FIG. 10) may be performed. The external connection terminals 700 may be formed by attaching the solder bumps or the solder balls to the external connection portions 231 exposed by removing the carrier substrate 400 or the adhesive layer 410.

Referring to FIG. 11 together with FIG. 2, the external connection portions 231 may be provided as a member electrically expanding the through electrode portions 210 to the outside. Although the through electrode portions 210 are disposed to be located at the portion of the interposer wafer 109 overlapped with the semiconductor dies 500, as the external connection portions 231 are located at the position extended to outside from the through electrode portions 210 by the extension portion 230, the external connection portions 231 may be disposed at not a position aligned with the die connection portions 510 but an offset position. The external connection terminals 700 connected to the external connection portions 231 may also be provided to be located at not a position aligned with the die connection portions 510 but the offset position.

Since the external connection portions 231 are provided at not a position aligned with the die connection portions 510 but the offset position, the external connection portions 231 may be provided to have the line width size S2 of FIG. 2 and the pitch size P2 of FIG. 2 different from those of the die connection portions 510. Since the end portions 211 of the through electrode portions 210 are located to be aligned with the die connection portions 510, the through electrode portions 210 or the end portions 211 of the through electrode portions 210 may be provided to have the substantially same arrangement pitch size P1 of FIG. 2 as the arrangement pitch size of the die connection portions 510. The line width size S1 of FIG. 2 of the end portions 211 of the through electrode portions 210 need not to be same as the line width size of the die connection portions 510. However, the line width size S1 of the end portions 211 of the through electrode portions 210 may be limited to a smaller size than the pitch size P1 so as to induce substantially same pitch size P1. For the through electrode portions 210 are formed to have the end portions 211 of a fine line width size S1 of FIG. 2, the process for forming the through electrode portions 210 may be performed by applying a silicon process using the silicon interposer wafer 209. The external connection portions 231 may be disposed to have the larger line width size S2 of FIG. 2 than the line width size S1 of FIG. 2 of the end portions 211 of the through electrode portions 210, and to have the larger arrangement pitch size P2 than the arrangement pitch size P1 of FIG. 2 of the end portions 211 of the through electrode portions 210.

Referring back to FIG. 11, the resultant structure of the step of attaching the external connection terminals 700 to the external connection portions 231 may be separated into individual semiconductor packages by performing a singulation process. The resultant structure may be separated into the individual packages by using a cutting process such as a laser cutting, a mechanical blade sawing. Referring to FIG.

1 together with FIG. 11, the interposer wafer 109 may become a shape of an individual package including the interposer die 109A of FIG. 1 through the separating process.

Figure 12:
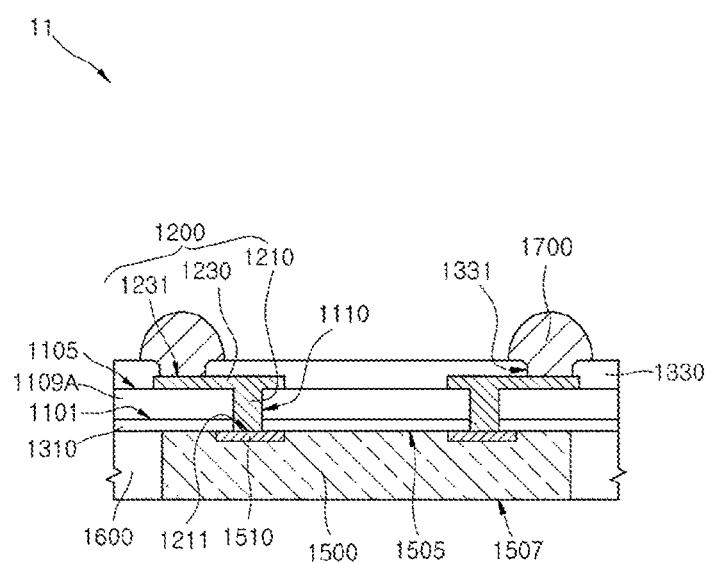
FIG. 12 is a cross-sectional view illustrating a representation of an example of a semiconductor package according to an embodiment.

FIG. 12 is a cross-sectional view illustrating a representation of an example of a semiconductor package structure according to an embodiment.

Referring to FIG. 12, a semiconductor package 11 may include a laminated structure of an interposer die 1109A and a semiconductor die 1500. The interposer die 1109A may be a shape of a plate including a first surface 1101 which may be a front surface and a second surface 1105 which may be a backside surface opposite to the first surface 1101. The interposer die 1109A may be a shape of an individual die separated from the interposer wafer that may be provided as a bare silicon wafer. The interposer die 1109A may be formed by processing the bare silicon wafer. The interposer die 1109A may be provided with a substrate of a glass material.

The interposer die 1109A may be introduced as a member including interconnection structures 1200 and providing electrical connecting wires. Each of the interconnection structures 1200 may include a through electrode portion 1210 substantially penetrating the body of the interposer die 1109A from the second surface 1105 to reach the first surface 1101 opposite to the second surface 1105. The through electrode portions 1210 may be provided to penetrate a first dielectric layer 1310 introduced between the interposer die 1109A and the semiconductor dies 1500 and bonding them to each other. End portions 1211 of the through electrode portions 1210 may be exposed from the first surface 1101. The portions opposite to the end portions 1211 of the through electrode portions 1210 may be located on the second surface 1105 and may extend by extension portions 1230. The extension portion 1230 may be provided as a connection portion or an expansion portion connecting the external connection portion 1231 located at the portion of the second surface 1105 of the interposer die 1109A spaced apart and offset from the through electrode portion 1210 by a predetermined distance and the through electrode portion 1210. The extension portion 1230, the external connection portion 1231 and the through electrode portion 1210 forming the interconnection structure 1200 may have a body and may be provided with an integrated single body layer. As the extension portion 1230, the external connection portion 1231 and the through electrode portion 1210 are provided with a single extended conductive layer not separated layers, the resistance increase due to the contact of the layers can be prevented.

A dielectric layer pattern 1330 having openings 1331 exposing the surface of the external connection portions 1231 may be provided on the second surface 1105 of the interposer die 1109A. External connection terminals 1700 for external connection may be attached on the external connection portions 1231. Each of the external connection terminals 1700 may include a connecting member such as a solder bump or a solder ball.

The semiconductor dies 1500 may be mounted on the first surface 1101 of the interposer die 1109A. The semiconductor die 1500 may have the shape of a chip including a third surface 1505 having die connection portions 1510 for electrical connection to the interposer die 1109A and a fourth surface 1507 opposite to the third surface 1505. Protection portions 1600 covering the first surface 1101 of the interposer die 1109A and protecting the side portions of the semiconductor dies 1500 may be provided.

The external connection portions 1231, a part of the interconnection structure 1200, may be provided on the second surface 1105 as members electrically expanding the through electrode portions 1210 to outside. Although the through electrode portions 1210 are disposed to be located at the portion of the interposer die 1109A overlapped with the die connection portions 1510 of the semiconductor dies 1500, since the external connection portions 1231 located at a position extended by the extension portions 1230 from the through electrode portions 1210 to the outside, the external connection portions 1231 may be provided to be located at not a position aligned with the die connection portions 1510 but an offset position. The external connection terminals 1700 connected to the external connection portions 1231 may also be provided to be located at not a position aligned with the die connection portions 1510 but an offset position.

Since the external connection portions 1231 may be provided to be located at not a position aligned with the die connection portions 1510 but an offset position, the external connection portions 1231 may have the line width size and pitch size different from those of the die connection portions 1510. Since the end portions 1211 of the through electrode portions 1210 are located to aligned with the die connection portions 1510, the through electrode portions 1210 or the end portions 1211 of the through electrode portions 1210 may be provided to have the substantially same arrangement pitch size as the arrangement pitch size of the die connection portions 1510. The external connection portions 1231 may be disposed to have the larger line width size than the line width size of the end portions 1211 of the through electrode portions 1210, and have the larger arrangement pitch size than the arrangement pitch size of the end portions 1211 of the through electrode portions 1210.

FIGS. 13 to 20 are cross-sectional views illustrating representations of examples of a method of manufacturing the semiconductor package according to various embodiments.

Figure 13:
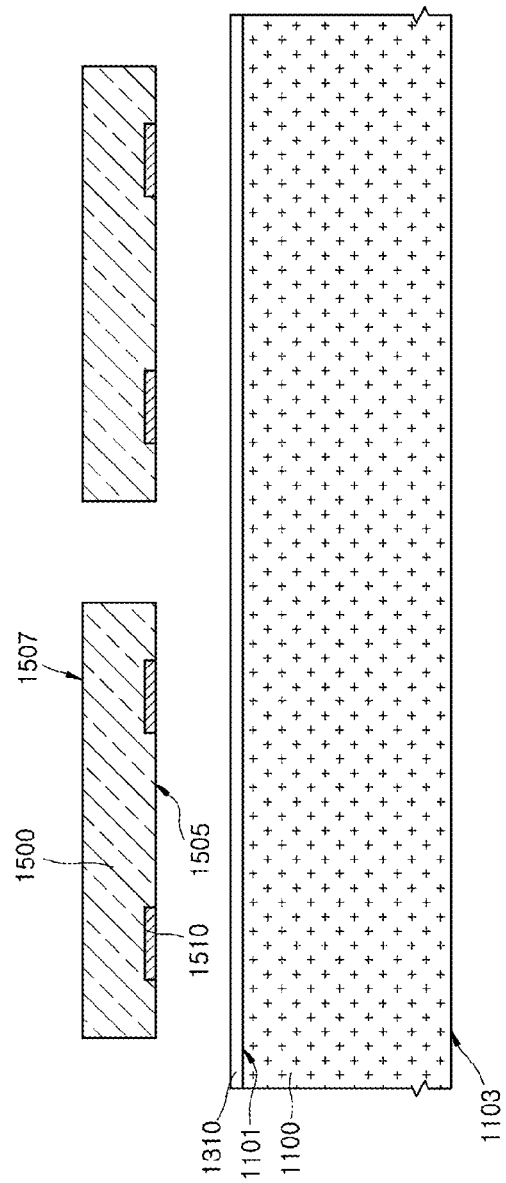
FIGS. 13 to 20 are cross-sectional views illustrating representations of examples of methods of manufacturing a semiconductor package according to various embodiments.

FIG. 13 illustrates the step of mounting the semiconductor dies 1500 on the interposer wafer 1100. Referring to FIG. 13, the interposer wafer 1100 may have a shape of a substrate or a wafer including the first surface 1101 which may be a front surface and the second surface 1103 which may be an initial backside surface and opposite to the first surface 1101. The interposer wafer 1100 may be provided with a bare silicon wafer. The interposer wafer 1100 may also be provided with a glass material having the shape of a wafer.

The first dielectric layer 1310 for attachment may be formed on the first surface 1101 of the interposer wafer 1100. The first dielectric layer 1310 may be introduced as an adhesion layer attaching the semiconductor dies 1500 which are to be mounted on the first surface 1101 of the interposer wafer 1100 to the interposer wafer 1100. The semiconductor dies 1500 may be introduced side by side to be aligned on the first surface 1101 so that the die connection portions 1510 are faced to the first surface 1101 of the interposer wafer 1100. Each of the semiconductor dies 1500 may be a memory semiconductor die including integrated circuits integrated thereon. The semiconductor die 1500 may have the shape of a chip including a third surface 1505 on which die connection portions 1510 for electrical connection to outside are disposed and a fourth surface 1507 opposite to the third surface 1505.

Figure 14:
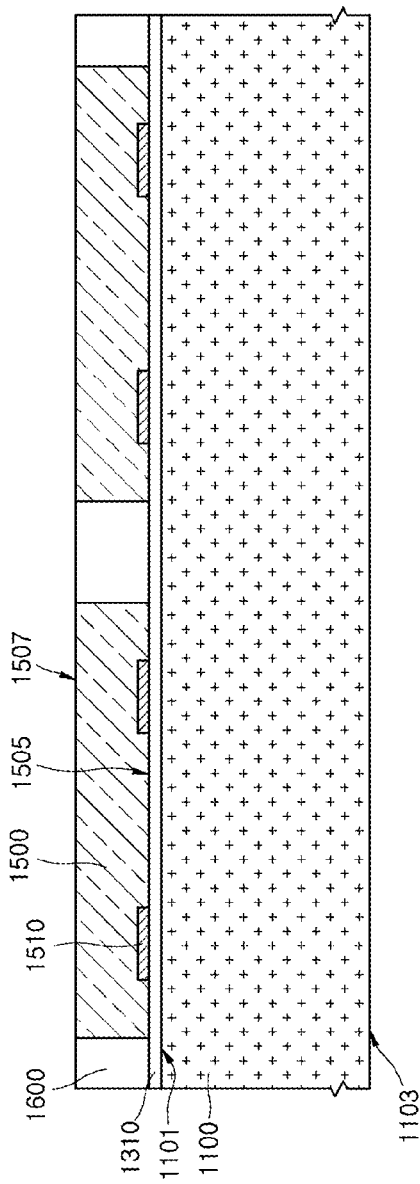

FIG. 14 illustrates the step of forming the protection portions 1600. Referring to FIG. 14, the protection portions 1600 covering the first dielectric layer 1310 and protecting the side portions of the semiconductor dies 1500 may be formed on the first surface 1101 of the interposer wafer 1100. The protection portions 1600 may be formed of a dielectric material. The dielectric material may include epoxy molding compound (EMC). The protection portions 1600 may be formed by performing a molding process after mounting a plurality of semiconductor dies 1500 side by side on the first dielectric layer 1310 on the first surface 1101 of the interposer wafer 1100. The protection portion 1600 may be molded to fill the portions between the semiconductor die 1500 and the adjacent different semiconductor die 1500. The protection portions 1600 may be formed so that the fourth surface 1507 of the semiconductor die 1500 is exposed. If the protection portions 1600 are formed to expose the fourth surface 1507 of the semiconductor dies 1500 without surrounding the fourth surface 1507, thin package may be realized because the total thickness of the semiconductor package does not increase that much. In addition, the heat generated in accordance with the operation of the semiconductor dies 1500 may be dissipated more effectively through the exposed fourth surface 1507. The protection portions 1600 may be formed to cover the side surfaces of the semiconductor dies 1500, in some cases, may be extend to cover the fourth surface 1507 of the semiconductor dies 1500.

Figure 15:
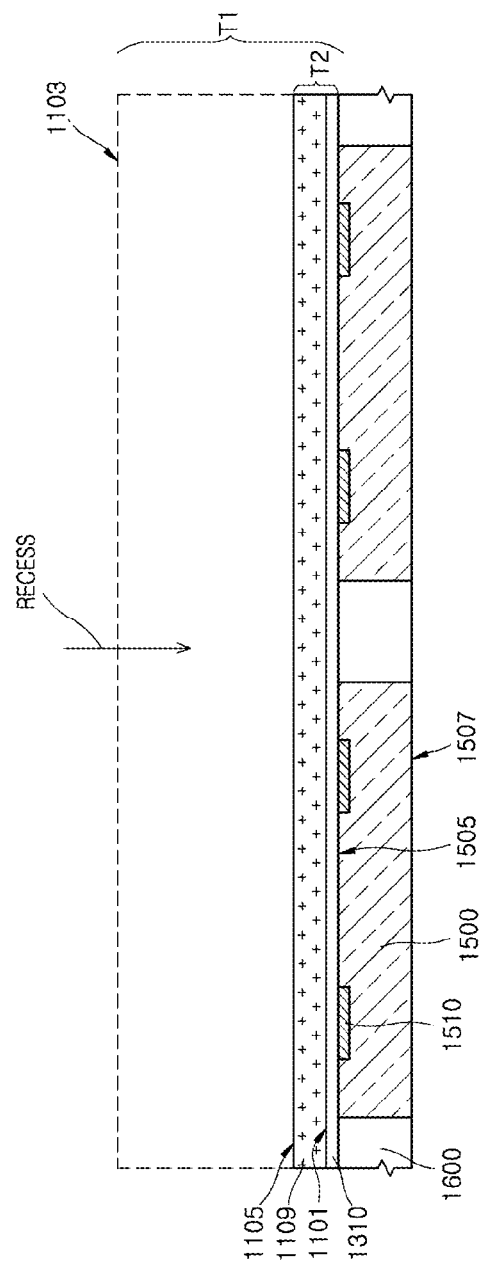

FIG. 15 illustrates the step of recessing the interposer wafer 1100. Referring to FIG. 15, the exposed second surface 1103 of the interposer wafer 1100 may be recessed. The process of recessing the second surface 1103 may be performed by etching or grinding the second surface 1103. A chemical mechanical polishing may be applied to the second surface 1103 in order to adjust the degree of recess more finely.

A recessed second surface 1105 may be provided by recessing the second surface 1103 of the interposer wafer 1100. Through this process, the interposer wafer 1100 can be transformed into an interposer wafer 1109 having thinner thickness T2 than the initial thickness T1. The interposer wafer 1109 thinned to have the thinner thickness T2 may be provided so that the first surface 1101 opposite to the recessed second surface 1105 is fixed by the first dielectric layer 1310 and the protection portions 1600. The structure including the protection portions 1600 molded to protect the semiconductor dies 1500 may play a role of a handling substrate or a carrier substrate during the recessing process for the interposer wafer 1109. The structure including the protection portions 1600 molded to protect the semiconductor dies 1500 may act as a member fixing the interposer wafer 1109 during the recessing process for the interposer wafer 1109, and may act as a handling substrate or a carrier substrate enabling the process by fixing the interposer wafer 1109 in the following subsequent process. The interposer wafer 1109 may have a thin thickness T2 to about 5 μm to 10 μm degree. Despite the processed interposer wafer 109 to a thin thickness like this, the interposer wafer 1109 can be maintained in a state capable of being handled by the structure including the molded protection portions 1600.

Figure 16:
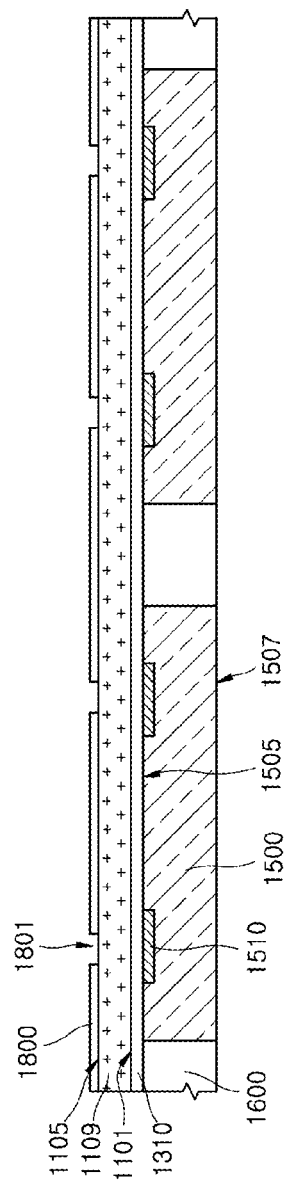

FIG. 16 illustrates the step of forming an etch mask 1800 on the recessed second surface 1105 of the interposer wafer 1109. Referring to FIG. 16, an etch mask 1800 having openings 1801 exposing portions of the second surface 1105 may be formed on the second surface 1105 of the interposer wafer 1109. The etch mask 1800 may include a photoresist material. The openings 1801 of the etch mask 1800 may be formed to expose the second surface 1105 region overlapped with the die connection portions 1510 of the semiconductor dies 1500. A first opening 1801 of the etch mask 1800 may be aligned with the die connection portion 1510 of the semiconductor die 1500.

Figure 17:
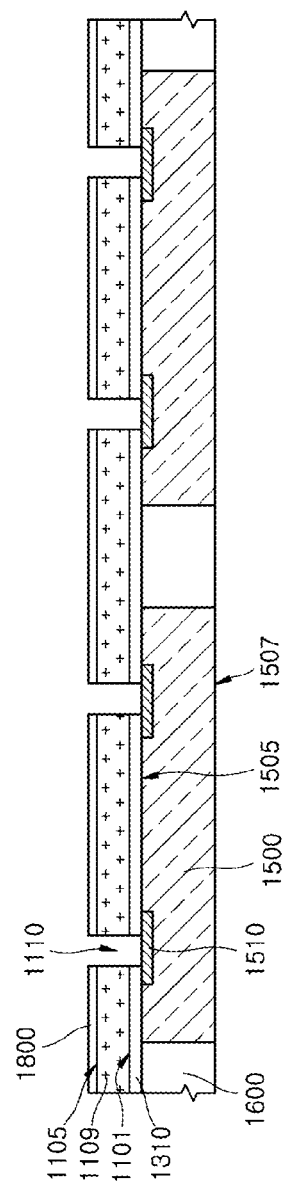

FIG. 17 illustrates the step of forming via holes 1110. Referring to FIG. 17, the via holes 1110 exposing surfaces of the die connection portions 1510 of the semiconductor dies 1500 may be formed on the second surface 1105 of the interposer wafer 1109. The via holes 1110 may be formed to have the depth of about 5 μm to about 10 μm using a dry etching process, a wet etching process or a laser etching process. The via holes 1110 may be formed by removing the exposed second surface 1105 portions to the first openings 1801 of FIG. 16 using the etch mask as a barrier, then etching and removing the first dielectric layer 1310 portions below the exposed interposer wafer 1109. The via holes 1110 may be located to be aligned with the die connection portions 1510 of the semiconductor dies 1500. The etch mask 1800 may be selectively removed after the etching process.

Figure 18:
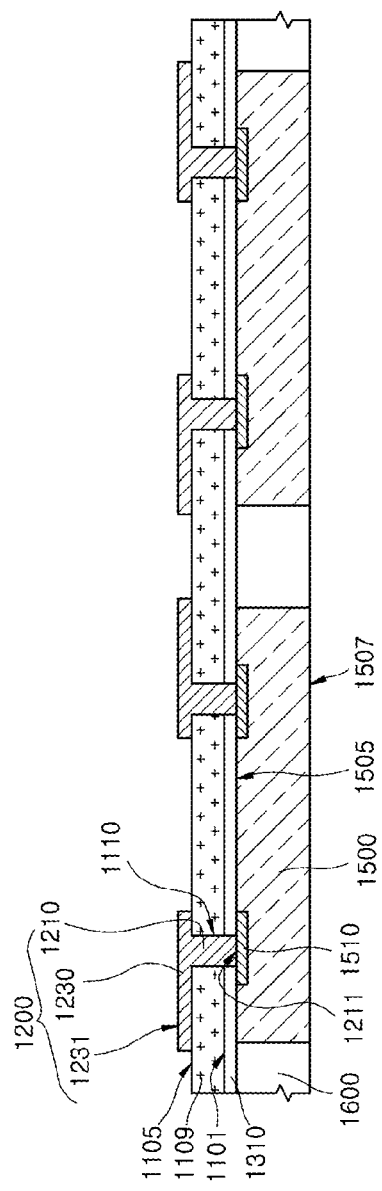

FIG. 18 illustrates the step of forming the interconnection structures 1200. Referring to FIG. 18, the interconnection structures 1200 filling the via holes 1110 and extending onto the second surface 1105 of the interposer wafer 1109 adjacent to the via holes 1100 may be formed. Although not illustrated, an insulation layer or a dielectric layer may be introduced on the interface between the interconnection structures 1200 and the body of the interposer wafer 1109 to electrically insulate the interconnection structures 1200 and the body of the interposer wafer 1109. The insulation layer may be provided with a layer including silicon oxide ($SiO_2$).

Each of the interconnection structure 1200 may include a through electrode portion 1210 filling the via hole 1110. End portion 1211 of the each through electrode portion 1210 may be located at bottom portion of the via hole 1110, and may be directly connected and fastened to the die connection portion 1510 exposed to the via hole 1110. An intermediate connecting member such as a separate bump or a solder layer may be disposed between the end portion 1211 of each the through electrode portion 1210 and the surface of the die connection portion 1510. Each of the interconnection structures 1200 may include an external connection portion 1231 which is located on the second surface 1105 of the interposer wafer 1109 and is to be connected to external devices, such as other electronic components or a module substrate. Each of the interconnection structures 1200 may include an extension portion 1230 connecting the external connection portion 1231 to the through electrode portion 1210 and electrically extend the through electrode portion 1211 to substantially reach the external connection portion 1231. The external connection portions 1231 and the through electrode portions 1210 may be disposed to be matched one to one. The through electrode portions 1210, the external connection portions 1231 and the extension portions 1230 may be formed to include an extended and integrated layer with the substantially same layer.

The external connection portion 1231 and the extension portion 1230 may be formed in a layer with the through electrode portion 1210. Accordingly, as the external connection portion 1231 and the through electrode portion 1210 are not formed in the different separated layers, the process to form them may be simplified. For example, the layer of the interconnection structure 1200 having the shapes of the external connection portion 1231, the extension portion 1230 and the through electrode portion 1210 may be formed at the same time. As the depth of the via hole 1110 is relatively shallow, the conductive layer for the interconnection structure 1200 may be formed to extend onto the second surface 1105 of the interposer wafer 1100 to provide the external connection portion 1231 and the extension portion 1230 while filling the via hole 1110. The interconnection structure 1200 may be provided with a metal layer including copper (Cu) layer, but not limited thereto. The interconnection structure 1200 may further include a seed layer (not illustrated) for copper plating and a diffusion barrier (not illustrated) for preventing diffusion of copper ions. In an embodiment, the extension portion 1230 may extend in a direction opposite from the external connection portion 1231 on the second surface 1105.

Figure 19:
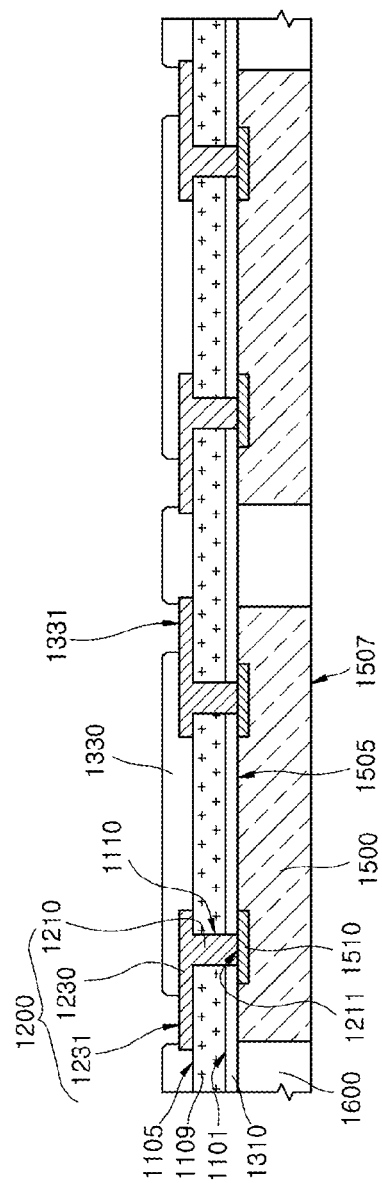

FIG. 19 illustrates the step of forming the second dielectric layer pattern 1330 exposing the external connection portions 1231. Referring to FIG. 19, the second dielectric layer pattern 1330 having openings 1331 exposing the surface of the external connection portions 1231 may be formed to cover the second surface 1105 of the interposer wafer 1109. The second dielectric layer pattern 1330 may cover and block the exposed portions of the through electrode portions 1210 exposed to the second surface 1105 of the interposer wafer 1109 and the extension portions 1230, and may be formed so that the external connection portions 1231 are exposed to outside. The second dielectric layer pattern 1330 may be formed of an organic polymer material. The second dielectric layer pattern 1330 may be formed including a photoresist material.

Figure 20:
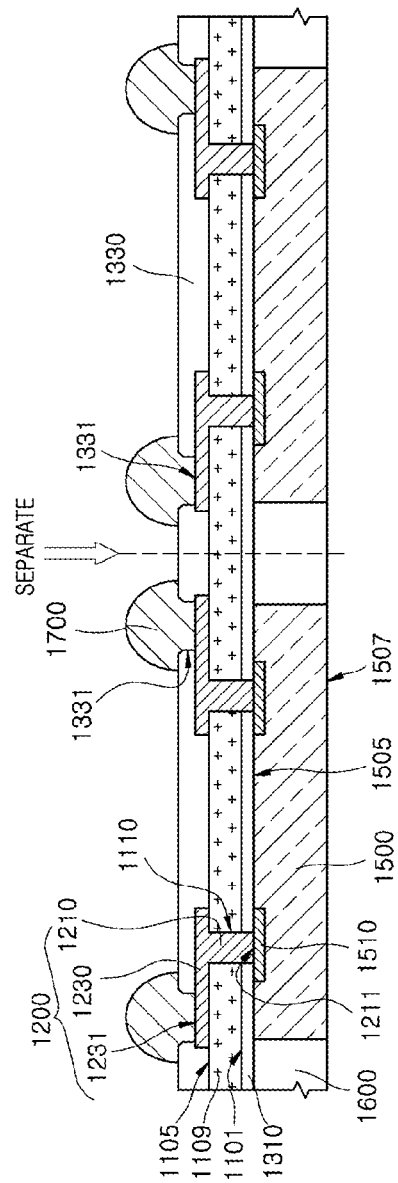

FIG. 20 illustrates the step of attaching the external connection terminals 1700 to the external connection portions 1231. Referring to FIG. 20, the external connection terminals 1700 for external connection may be attached to the external connection portions 1231. Each of the external connection terminals 1700 may include a connecting member such as a solder bump or a solder ball.

Each of the external connection portions 1231 may be provided as a member electrically extending the through electrode portion 210 to the outside. The through electrode portions 1210 are disposed at a portion overlapped with the semiconductor dies 1500 at the interposer wafer 109. The external connection portion 1231 may be located at the position biased to one side from the through electrode portion 1210 by the extension portion 1230, and may be disposed at the position offset with respect to the die connection portion 1510. The external connection terminals 1700 connected to the external connection portions 1231 may also be provided to be located at not a position aligned with the die connection portions 1510 but the offset position.

Since the external connection portions 1231 are provided at not a position aligned with the die connection portions 1510 but the offset position, the external connection portions 1231 may have the line width size and the pitch size different from those of the die connection portions 1510. The external connection portions 1231 may be disposed having larger line width size than the line width size of the end portions 1211 of the through electrode portion 1210, and having the larger arrangement pitch size than the arrangement pitch size of the end portions 1211 of the through electrode portion 1210.

Referring back to FIG. 20, the resultant structure of the step of attaching the external connection terminals 1700 to the external connection portions 1231 may be separated into individual semiconductor packages by performing a singulation process. The resultant structure may be separated into the individual packages by using a cutting process such as a laser cutting, a mechanical blade sawing. Referring to FIG. 12 together with FIG. 20, the interposer wafer 1109 may become a shape of an individual package including the interposer die 1109A of FIG. 12 through the separating process.

Figure 21:
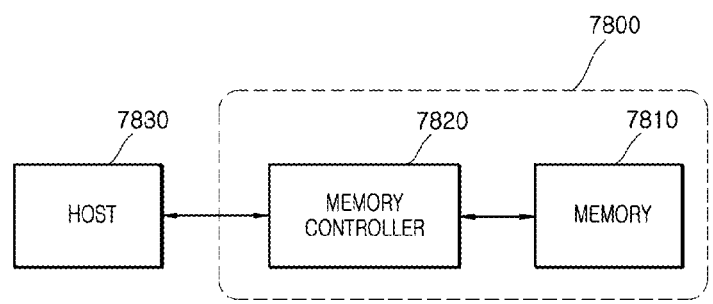
FIG. 21 is a block diagram illustrating a representation of an example of an electronic system employing a memory card including a package in accordance with an embodiment.

FIG. 21 is a block diagram illustrating a representation of an example of an electronic system including a memory card 7800 including at least one semiconductor device according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment.

The memory 7810 may include a nonvolatile memory device to which the technology of the embodiments of the present disclosure applied. The memory controller 7820 may control the memory 7810 such that stored data is read out or data is stored in response to a read/write request from a host 7830.

Figure 22:
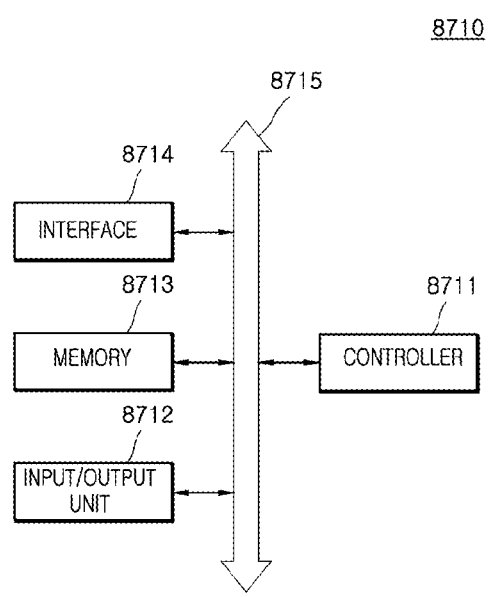
FIG. 22 is a block diagram illustrating a representation of an example of an electronic system including a package in accordance with an embodiment.

FIG. 22 is a block diagram illustrating a representation of an example of an electronic system 8710 including at least one device according to an embodiment. The electronic system 8710 may include a controller 8711, an input/output unit 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of manufacturing a semiconductor package, the method comprising:
forming via holes extending from a first surface of an interposer wafer into a body of the interposer wafer;
forming interconnection structures in the via holes and on the first surface of the interposer wafer, each of the interconnection structures including a through electrode portion filling one of the via holes, an external connection portion disposed on the first surface of the interposer wafer, and an extension portion connecting the through electrode portion to the external connection portion;
recessing a second surface of the interposer wafer opposite to the external connection portions to expose end portions of the through electrode portions at the recessed second surface;
mounting a semiconductor die on the recessed second surface of the interposer wafer to electrically connect die connection portions of the semiconductor die to the end portions of the through electrode portions;
forming a protection portion covering the semiconductor die on the recessed second surface of the interposer wafer; and
attaching external connection terminals to the external connection portions,
wherein the external connection portion is located on the first surface of the interposer wafer to be spaced apart from the through electrode portion by a predetermined distance, and
wherein the external connection terminal is spaced apart from the through electrode portion.

2. The method of claim 1, wherein the interposer wafer includes a silicon wafer.

3. The method of claim 1, wherein forming the interconnection structure comprises forming a conductive layer filling the via holes to provide the through electrode portions and extending onto the first surface of the interposer wafer to provide the external connection portions and the extension portions.

4. The method of claim 1, wherein the via holes are formed to be aligned with the die connection portions of the semiconductor die, respectively.

5. The method of claim 1, wherein the external connection portions are formed to be offset from the die connection portions of the semiconductor die, respectively.

6. The method of claim 1, wherein each of the external connection portions is formed to have a line width size which is greater than that of each of the through electrode portions.

7. The method of claim 1, wherein the external connection portions are formed to have a pitch size which is greater than that of the through electrode portions.

8. The method of claim 1, further comprising attaching a carrier substrate to the first surface of the interposer wafer before recessing the second surface of the interposer wafer.

9. The method of claim 8, wherein the carrier substrate is removed to expose the external connection portions after forming the protection portion.

10. The method of claim 1,
wherein mounting the semiconductor die comprises forming interconnectors combining the die connection portions with the end portions of the through electrode portions; and
wherein each of the interconnectors includes a bump or an intermediate solder layer.

11. The method of claim 10, wherein the protection portion is formed to extend into a space between the semiconductor die and the interposer wafer and to surround the interconnectors.

* * * * *